(12) United States Patent
Nestler

(10) Patent No.: US 7,593,256 B2
(45) Date of Patent: Sep. 22, 2009

(54) MEMORY ARRAY WITH READOUT ISOLATION

(75) Inventor: Eric Nestler, Harvard, MA (US)

(73) Assignee: Contour Semiconductor, Inc., Billerica, MA (US)

( * ) Notice: Subject to any disclaimer, the term of this patent is extended or adjusted under 35 U.S.C. 154(b) by 138 days.

(21) Appl. No.: 11/729,322

(22) Filed: Mar. 28, 2007

(65) Prior Publication Data

US 2007/0230243 A1 Oct. 4, 2007

Related U.S. Application Data

(60) Provisional application No. 60/787,247, filed on Mar. 28, 2006.

(51) Int. Cl.
*G11C 7/00* (2006.01)

(52) U.S. Cl. ...................... 365/175; 365/226

(58) Field of Classification Search ............ 365/175, 365/226
See application file for complete search history.

(56) References Cited

U.S. PATENT DOCUMENTS

| | | | |
|---|---|---|---|
| 3,245,051 A | 4/1966 | Robb | |
| 3,576,549 A | 4/1971 | Hess et al. | |
| 3,721,964 A | 3/1973 | Barrett et al. | |
| 3,838,405 A | 9/1974 | Arnett et al. | |
| 4,010,453 A * | 3/1977 | Lewis | 365/205 |
| 4,308,595 A * | 12/1981 | Houghton | 365/149 |
| 4,394,752 A | 7/1983 | Boudon et al. | |
| 4,561,070 A | 12/1985 | Armstrong | |
| 4,757,475 A | 7/1988 | Awaya et al. | |
| 5,441,907 A | 8/1995 | Sung et al. | |
| 5,673,218 A | 9/1997 | Shepard | |
| 5,840,608 A | 11/1998 | Chang | |
| 5,889,694 A | 3/1999 | Shepard | |
| 6,055,180 A | 4/2000 | Gudesen et al. | |
| 6,163,475 A * | 12/2000 | Proebsting | 365/63 |
| 6,198,682 B1 * | 3/2001 | Proebsting | 365/207 |
| 6,351,023 B1 | 2/2002 | Gates et al. | |
| 6,385,075 B1 | 5/2002 | Taussig et al. | |
| 6,462,998 B1 * | 10/2002 | Proebsting | 365/205 |
| 6,586,327 B2 | 7/2003 | Shepard | |
| 6,587,394 B2 | 7/2003 | Hogan | |
| 6,598,164 B1 | 7/2003 | Shepard | |
| 6,956,757 B2 | 10/2005 | Shepard | |
| 7,149,934 B2 | 12/2006 | Shepard | |
| 7,183,206 B2 | 2/2007 | Shepard | |
| 2003/0026120 A1 | 2/2003 | Scheuerlein | |
| 2004/0160805 A1 | 8/2004 | Rinerson et al. | |
| 2005/0030810 A1 | 2/2005 | Shepard | |
| 2005/0067675 A1 | 3/2005 | Shepard | |
| 2006/0013029 A1 | 1/2006 | Shepard | |

(Continued)

OTHER PUBLICATIONS

U.S. Appl. No. 09/821,182, Shepard.

(Continued)

*Primary Examiner*—Michael T Tran
(74) *Attorney, Agent, or Firm*—Goodwin Procter LLP

(57) ABSTRACT

Methods and apparatus for differentially measuring the bit state of a particular element in an array of passive nonlinear elements against the output of a reference generator. The reference generator may be, for example, a dummy row circuit, a dummy column circuit, or both a dummy row circuit and a dummy column circuit.

28 Claims, 12 Drawing Sheets

U.S. PATENT DOCUMENTS

2007/0028150 A1 2/2007 Shepard

OTHER PUBLICATIONS

U.S. Appl. No. 11/665,470, Shepard.

U.S. Appl. No. 10/624,079, Shepard.

"Summary Page: National Radio Institute 832," Old-Computers. com, <http://old-computers.com/museum/computer.asp?c=884&st=1>, (Apr. 4, 2007), 2 pages.

Hodges, et al. "Analysis and Design of Digital Integrated Circuits," McGraw-Hill Book Company, pp. 27-32.

Crawford, et al. "An Improved Tunnel Diode Memory System," IBM Journal, (Jul. 1963) pp. 199-206.

Near, et al. "Read-Only Memory Adds To Calculator's Repertoire," Electronics, (Feb. 3, 1969), pp. 70-77.

De Graaf, et al. "A Novel High-Density Low-Cost Diode Programmable Read Only Memory," IEEE IEDM, session 7.6.1, (1996), pp. 189-192.

Wang, et al, "High-Current-Density Thin-Film Silicon Diodes Grown at Low Temperature," Applied Physics Letters, vol. 85(11), (Sep. 13, 2004), pp. 2122-2124.

Hurst, "A Survey of Published Information on Universal Logic Arrays," Microelectronics and Reliability, vol. 16, (1977), pp. 663-674.

McConnell, et al. "Diode-Transistor Logic," Digital Electronics, Chapter 5, West Virginia University, (2002), pp. 1-14.

Berger, "Models for Contacts to Planar Devices," Solid-State Electronics, vol. 15, (1972), pp. 145-158.

Wang, et al, "Low Temperature Thin-Film Silicon Diodes for Consumer Electronics," Mater. Res. Soc. Symp. Proc. vol. 862, (2005), pp. A15.5.1-A15.5.6.

International Search Report for corresponding PCT Application No. PCT/US2007/007792 mailed Oct. 30, 2007 (3 pages).

Written Opinion for corresponding PCT Application No. PCT/US2007/007792 mailed Oct. 30, 2007 (7 pages).

\* cited by examiner

Row Address AND Decoder

Column Address OR Decoder

Column address OR decoder

MEMORY ARRAY WITH READOUT ISOLATION

CROSS-REFERENCE TO RELATED APPLICATIONS

The present application claims the benefit of co-pending U.S. provisional application Ser. No. 60/787,247, filed on Mar. 28, 2006, the entire disclosure of which is hereby incorporated by reference as if set forth in its entirety herein. The present application is also related to the applications having Ser. Nos. 11/729,423 and 11/729,323, filed herewith.

FIELD OF THE INVENTION

The present invention relates generally to passive memory devices, and more specifically to the off-chip detection of bit states on a passive memory device.

BACKGROUND OF THE INVENTION

There are many forms of semiconductor-based digital memory. The most common forms—such as static random access memory (SRAM), dynamic random access memory (DRAM), and Flash memory—typically require complicated semiconductor fabrication processes to achieve high memory densities. This goal of high density—measured by the number of bits of data per square centimeter—is desirable for many reasons, not the least of which is to achieve a low cost per bit of storage given the expense of fabrication.

Diode memory arrays are one particular form of semiconductor-based digital memory. U.S. Pat. No. 5,673,218 ("the '218 patent"), for example, describes a memory circuit in which diodes serve as the memory elements. This type of circuit can achieve a low cost per bit of storage due to the simplicity of the semiconductor processing required to fabricate diodes. During fabrication, a diode-only process might require only five or six masks using photolithography, or three or four chemical-mechanical polishing (CMP) and etch steps using topolithography. In contrast, a typical process to create a Flash memory can require 35 masks during fabrication.

FIG. 1 presents a diagram of a diode memory array 100. Most memory applications typically use a dense-array matrix structure for the memory bits themselves and typically implement some type of binary decoding for row and column selection. Binary decoding converts n digital inputs into a maximum of $2^n$ unique outputs, allowing relatively few digital address inputs to select many rows or columns, thereby reducing the complexity of the circuitry needed to access a bit state in the memory array. As depicted in FIG. 2, in one embodiment the row decoder 104' and column multiplexer 108' of FIG. 1 may be implemented using AND logic gates and OR logic gates.

Referring again to FIG. 1, the diode memory array 100 includes many bits that are individually accessible by setting the appropriate input address bits on the row decoder 104 and the column decoder 108. Facilitating the off-chip detection of the state of a selected bit without slowing or otherwise affecting the operation of the array is typically a considerable design challenge. Accordingly, it would be desirable to have apparatus and methods that facilitate the off-chip detection of a selected bit state in a memory array.

SUMMARY OF THE INVENTION

The present invention provides methods and apparatus for differentially measuring the bit state of a particular element in an array of passive nonlinear elements against the output of a reference generator. The reference generator may be, for example, a dummy row circuit, a dummy column circuit, or a dummy row circuit and a dummy column circuit.

In one aspect, embodiments of the present invention provide an information-storage circuit having a first set of generally parallel conductive lines, and a second set of generally parallel conductive lines that is generally perpendicular to and overlapping with the first set of lines. The circuit also has a plurality of bit states, with each bit state of said plurality occurring in the general vicinity of a region of overlap between a line from the first set of lines and a line from the second set of lines, and the state of any bit state being determined by the presence or absence of a nonlinear element bridging a line from the first set of lines and a line from the second set of lines at a region of overlap. The circuit also includes a reference generator, such as a dummy row circuit or a dummy column circuit, for providing a reference value adapted for measurement and state measurement circuitry for determining a selected bit state by comparing the state of a selected bit against the reference value. The nonlinear element may be selected from the group consisting of a diode, a series combination of a diode and a contact opening, and a series combination of a diode and a one-time programmable element.

In one embodiment, the state measurement circuitry measures the charge associated with a selected bit. In this embodiment, each measured charge is stored on a capacitance. In another embodiment, the circuit includes a plurality of capacitances, each capacitance associated with a nonlinear element. Each capacitance may occur between one of the nonlinear elements and a line selected from the first set of lines or the second set of lines, or between a line from the first set of lines and a line from the second set of lines. In still another embodiment, the state measurement circuitry includes a comparator, which may be operated synchronously with the information-storage circuit. The comparator can detect a change in at least one of charge, voltage and current to determine a digital output state.

In another aspect, embodiments of the present invention provide a method for determining bit state in an information-storage circuit. A first set of generally parallel conductive lines is provided, as is a second set of generally parallel conductive lines that is generally perpendicular to and overlapping with the first set of lines. A plurality of bit states are provided, with each bit state of said plurality occurring in the general vicinity of a region of overlap between a line from the first set of lines and a line from the second set of lines, and the state of any bit state being determined by the presence or absence of a nonlinear element bridging a line from the first set of lines and a line from the second set of lines at a region of overlap. A reference generator is provided, such as a dummy row circuit or a dummy column circuit, that provides a reference value adapted for measurement, and state measurement is provided for determining a selected bit state by comparing the state of a selected bit against the reference value. The nonlinear element may be selected from the group consisting of a diode, a series combination of a diode and a contact opening, and a series combination of a diode and a one-time programmable element.

In one embodiment, providing state measurement circuitry comprises providing state measurement circuitry that measures the charge associated with a selected bit. In this embodiment, a plurality of capacitances is provided, wherein each measured charge is stored on a capacitance. In another embodiment, a plurality of capacitances is provided, with each capacitance associated with a nonlinear element. Each capacitance may occur between one of the nonlinear elements and a line selected from the first set of lines or the second set of lines, or between a line from the first set of lines and a line from the second set of lines. In still another embodiment, providing state measurement circuitry comprises providing state measurement circuitry including a comparator, which may be operated synchronously with the information-storage circuit. The comparator may detect a change in at least one of charge, voltage and current to determine a digital output state.

The foregoing and other features and advantages of the present invention will be made more apparent from the description, drawings, and claims that follow.

BRIEF DESCRIPTION OF DRAWINGS

The advantages of the invention may be better understood by referring to the following drawings taken in conjunction with the accompanying description in which.

In the drawings, like reference characters generally refer to corresponding parts throughout the different views. The drawings are not necessarily to scale, emphasis instead being placed on the principles and concepts of the invention.

DETAILED DESCRIPTION OF THE INVENTION

Embodiments of the present invention provide methods and apparatus to facilitate access to bit states in a memory array. Particular embodiments facilitate address decoding and on-chip output generation using passive elements, such as diodes, or diodes in combination with a contact opening or a one-time programmable element. Embodiments of the present invention allow for the detection of the generated output outside the chip package in a manner that does not interfere with the operation of the memory array.

Memory Array and Elements

Figure 1:
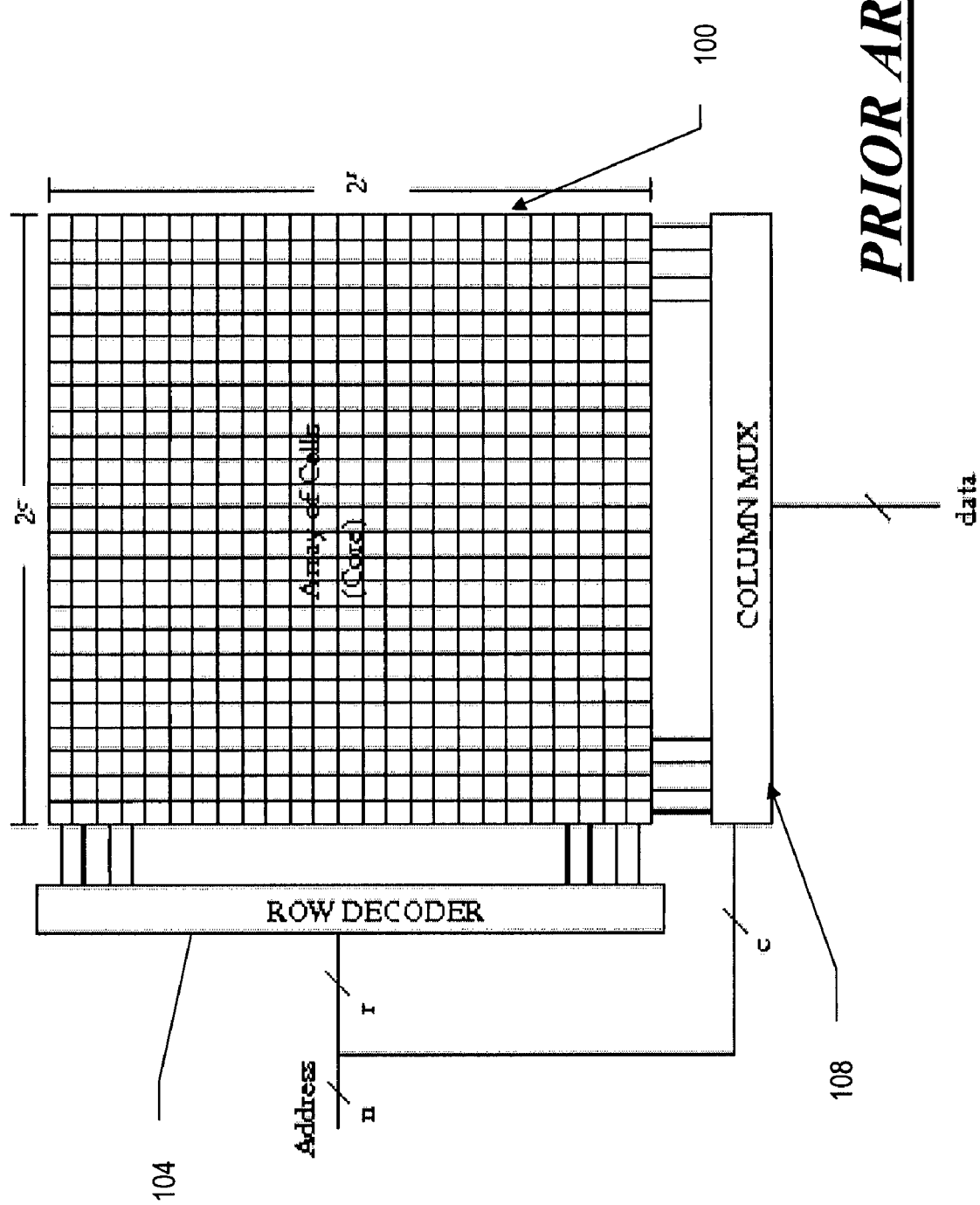
FIG. 1 is a diagram of one embodiment of a diode memory array.
Figure 2:
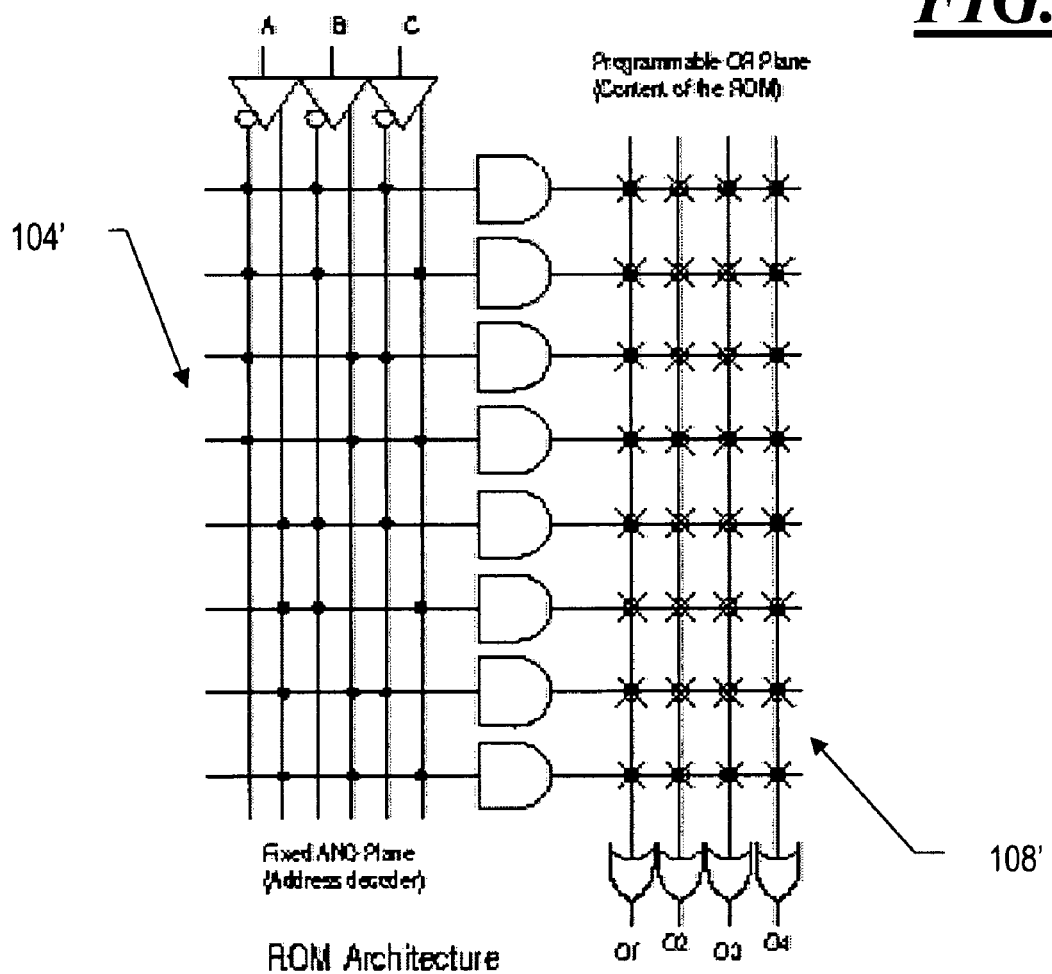
FIG. 2 presents an exemplary implementation of a row decoder and a column decoder for use with a memory array.
Figure 3:
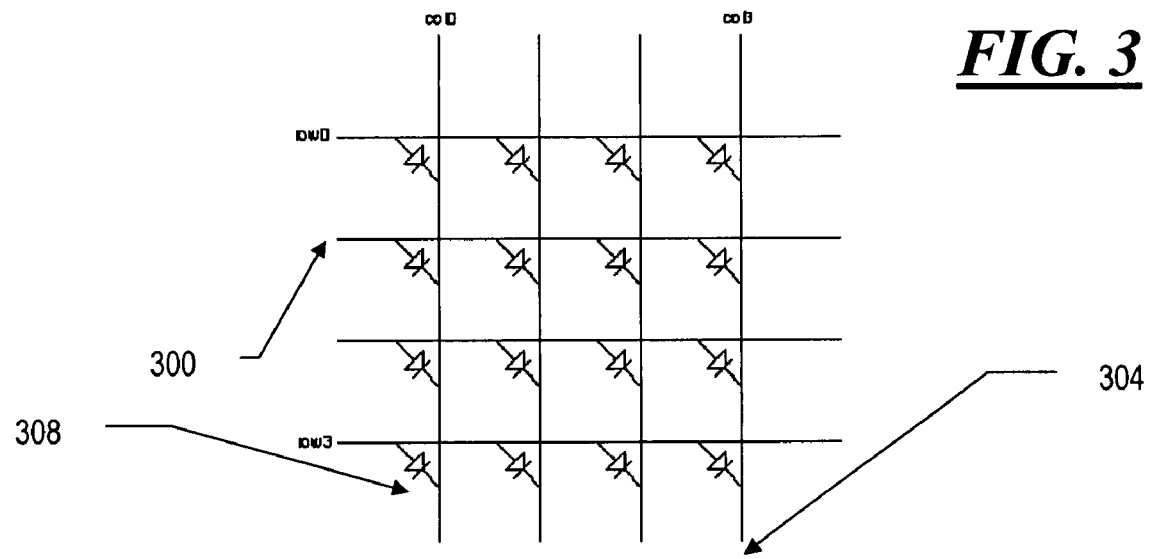
FIG. 3 presents an overhead view of one embodiment of a cross-bar memory array utilizing passive rectifier elements for use with the present invention.

FIG. 3 depicts one embodiment of a crossbar memory array for use with the present invention. The array includes a first plurality of conductors 300 generally parallel to each other, and a second plurality of conductors 304 also generally parallel to each other. As shown in FIG. 3, the first plurality of conductors 300 and the second plurality of conductors 304 are arranged so that they are generally perpendicular to and overlapping each other, resulting in a grid or lattice having rows 300 and columns 304 when viewed from overhead.

The space between the two sets of conductors 300, 304 holds a plurality of vertically-oriented rectifier elements 308, here P-N junction diodes. To provide an array having a maximum bit density per unit area, a diode 308 is formed at each region of overlap between the first set of conductors 300 and the second set of conductors 304. The diode 308 may be formed in series combination with a capacitor or one-time programmable element (not shown).

The design of FIG. 3 is symmetric and the circuit may instead utilize diodes having the opposite orientation (i.e., having the N+ terminal rather than the P+ terminal connected to the rows 300). The diode orientation in a particular embodiment may be determined by particular optimizations for performance and manufacturing that favor one orientation over the other. The size of a particular diode element 308 is determined by process-layout rules.

One embodiment of the present invention utilizes semiconductor memory fabricated in three dimensions (not shown). One such embodiment is described in U.S. Pat. No. 6,956,757, assigned to Contour Semiconductor, Inc., the contents of which are hereby incorporated by reference, although other three dimensional semiconductor memories may be utilized with various embodiments of the present invention.

Figure 4A:
FIG. 4A depicts an individual memory element lacking a contact opening.

With reference to FIG. 4A, when the diode array is used to implement a read-only memory (ROM), setting a bit state in this type of crossbar memory involves placing or omitting a contact opening 400 on top of each diode 308, between the diode 308 and a conductor from the first plurality of conductors 300 or the second plurality of conductors 304. In another embodiment, setting a particular bit state in this type of crossbar ROM may be accomplished by omitting the entire diode structure 308. In still other embodiments, setting a bit state involves burn through or destructive shorting of a capacitor or other antifuse element in series combination with the diode.

Figure 4B:
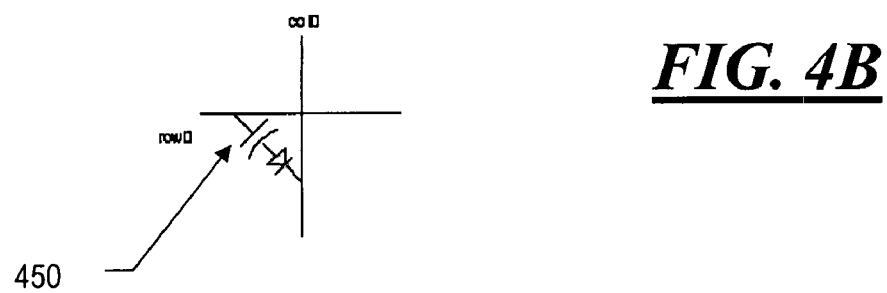
FIG. 4B presents a simulation model of an individual memory element lacking a contact opening.

While FIG. 4A presents a functional schematic of a single diode element 308 in a crossbar memory array lacking a contact opening, FIG. 4B presents a simulation model for that same element. In particular, the presence of a conductor in proximity to a diode structure creates a capacitance between the conductor and the proximal end of the diode structure. FIG. 4B illustrates this parasitic capacitance 450, which should be considered when simulating or analyzing embodiments of the present invention. As discussed below, other parasitic capacitances may be relevant to simulation and analysis.

Row and Column Decoder Design

Figure 5A:
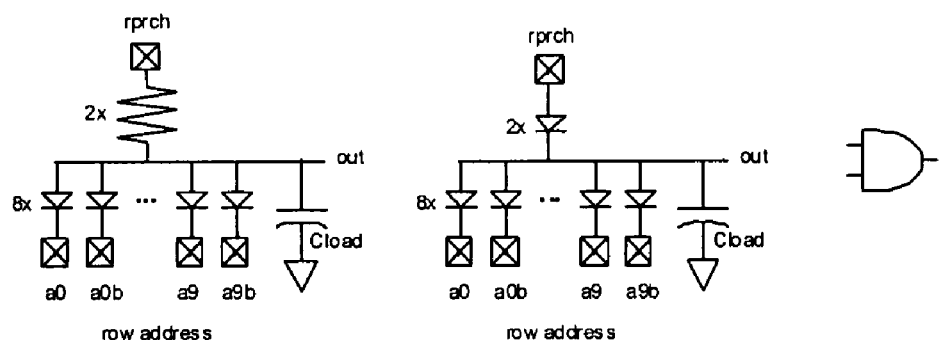
FIG. 5A presents one implementation of a row address decoder for use with the present invention.
Figure 5B:
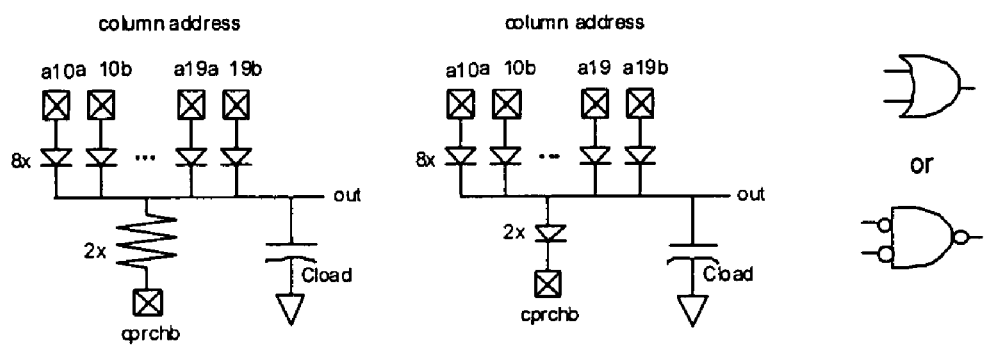
FIG. 5B illustrates an embodiment of a column address decoder for use with the present invention.
Figure 5C:
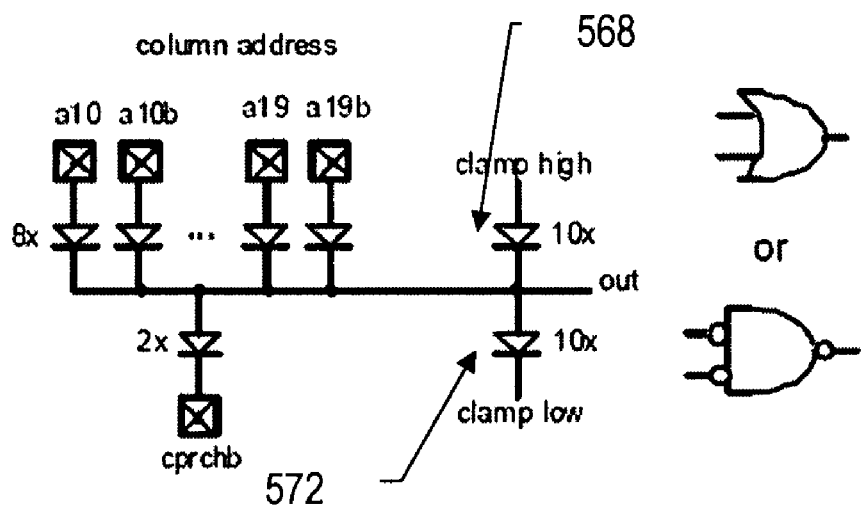
FIG. 5C shows an embodiment of a column address decoder having pull-up and pull-down diodes.

FIG. 5A presents two implementations of a row decoder using functional logic gates. FIGS. 5B and 5C together present three implementations of a column decoder using functional logic gates. As depicted, the implementations use resistor and diode pull-ups and pulldowns.

As with conventional random access memories organized in an array, in a diode array any particular accessed bit of memory is located at the intersection of a particular selected row and a particular selected column. The selection of a particular row or column in an array is typically controlled using a decoder that, as discussed above, demultiplexes a plurality of coded inputs into a larger set of decoded outputs.

There are several criteria to be considered when designing decoders for a diode memory array. First, to read a particular bit state, the diode associated with that state must forward biased and rendered conductive. In the exemplary diode array shown in FIG. 3, a selected row 300 is maintained at logic HIGH voltage and a selected column 304 is maintained at logic LOW voltage to forward bias the diode at the intersection between the selected row 300 and the selected column 304. With this diode forward biased, the bit state associated with the diode may be determined by measuring voltage, current, or charge to determine whether the selected diode actually bridges the addressed row and column lines.

Second, the difference between logic HIGH and logic LOW voltage levels on chip should be sufficient to forward bias a selected memory-bit diode. Third, the selection of the load device must be considered as, with reference to FIGS. 5A and 5B, the behavior of the logic gate implementation differs between a resistor load and a diode load.

FIG. 5C presents another implementation of a column address decoder using pull-up and pull-down diodes. In certain implementations of a passive device array, there is a possibility that parasitic capacitances, such as those typified in FIG. 4B, can result in unwanted capacitive coupling among individual device nodes in the array. This coupling can affect the charge and discharge cycles discussed below and thereby cause the array to output signals that are not necessarily reflective of the actual bit state of an addressed element in the array.

It may be possible to address this problem utilizing a larger voltage span for input signals, but the magnitude of input signals may ultimately be limited by the breakdown voltage of the individual elements in the array. The decoder depicted in FIG. 5C addresses this problem by using clamping diodes to clamp the columns while rows are being discharged. To reduce the charge pump effect from the rows to the columns, the clamping diodes are implemented on a per-column basis. Charge pumping may move a high impedance node toward either a higher or a lower voltage, so two diodes 568, 572 are used to pull up or pull down on the column depending on the direction of the charge pumping effect.

Address Decoder Operation

Diode logic gates, like other discrete logic gates, may be operated either statically or dynamically. In the case of dynamic operation, it is assumed that there is some equivalent capacitance at the output, shown in FIGS. 5A and 5B as $C_{load}$.

With reference to FIGS. 5A-5C, for a positive-logic implementation having a diode load, dynamic operation of the row and column decoders would first bring all of the inputs to logic HIGH either directly or by raising the N+ end of any pulldown diodes to logic HIGH. Then the P+ end of the pullup diodes is raised to logic HIGH, and subsequently brought down to logic LOW. The gate output is now determined by the charge stored on $C_{load}$ since, all of the diodes are either reverse-biased or OFF. Finally, the N+ ends of the input are set to a valid input state. Any input which is logic LOW would pull the gate output LOW by discharging the charge stored on $C_{load}$ through the LOW input diode. The gate output would only remain HIGH if the logical AND of the input states is logic HIGH. This sequence uses the power-supply end of the load diode as a control input, which is driven by off-chip logic.

This discussion of operation applies to the diode-load version of the diode logic gates. If the gates instead have resistive loads, for example, then the pullup impedance cannot be put in an OFF or high-impedance state, since a resistive load is always conductive. Even with a resistive load, however, dynamic operation may be implemented if the logic driving the outer end of the load resistor can be put into a high-impedance state using a logic function such as a tristate gate.

Unfortunately, the dynamic behavior of diode logic is restrictive. The precharge state is the state determined by the load device, so for positive logic the precharge state is always HIGH, while for negative logic the precharge state is always LOW. The preferred precharge state for a column decoder, however, is the opposite. Accordingly, the dynamic behavior of diode logic typically requires the column decoder to be operated statically during part of the read cycle. At this time, it is understood that this restriction may be avoided utilizing an inverting function or device.

Static Versus Dynamic Decoder Operation

As described above, to select a single memory diode in an array, the conductors associated with the diode must be biased so as to forward bias the diode. For example, in the embodiment of FIG. 3, a row conductor 300 should be logic HIGH and a column conductor 304 should be logic LOW to forward bias a particular diode element in an array. The selection of particular row and column conductors may be addressed using a row address decoder and a column address decoder, such as those depicted in FIG. 6.

One implementation of a row address decoder and a column address decoder would operate both decoders as static diode logic gates, connecting the pull-up and pull-down load devices to constant power supply pins, i.e., $V_{DD}$ or GND. Unfortunately, such an implementation would consume a significant amount of power, partly due to presence of a logic gate associated with each row and column. For example, for a one megabit array there would be approximately 2,000 gates running statically and simultaneously during the entire read access time. The dynamic operation of both decoders during each read access time would result in better performance, but the restrictions associated with the dynamic operation of diode logic would hinder this mode of operation.

Dynamic Row Address Decoder

Figure 6:
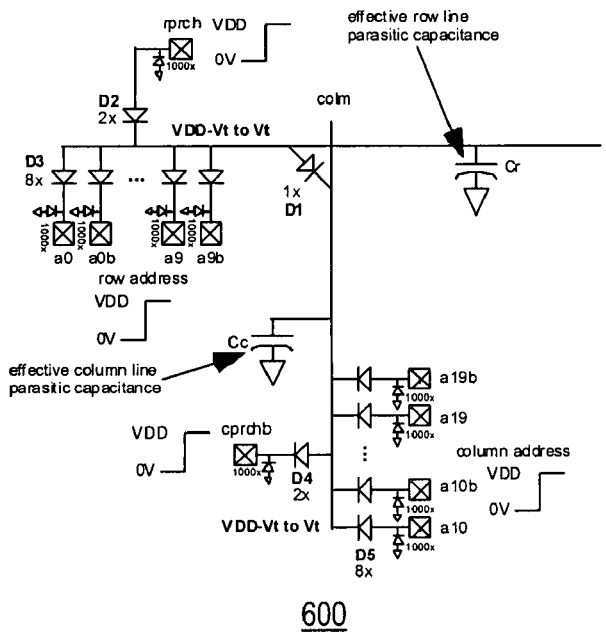
FIG. 6 depicts the use of row and column address decoders to select a particular diode in a diode memory array.
Figure 6:
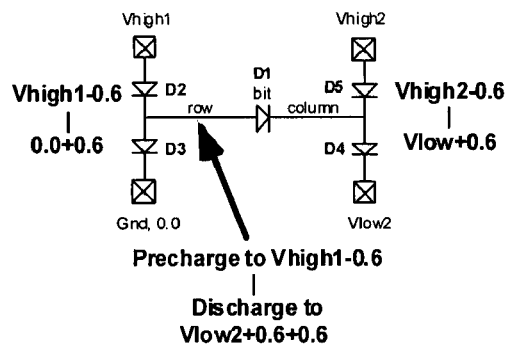
Figure 7A:
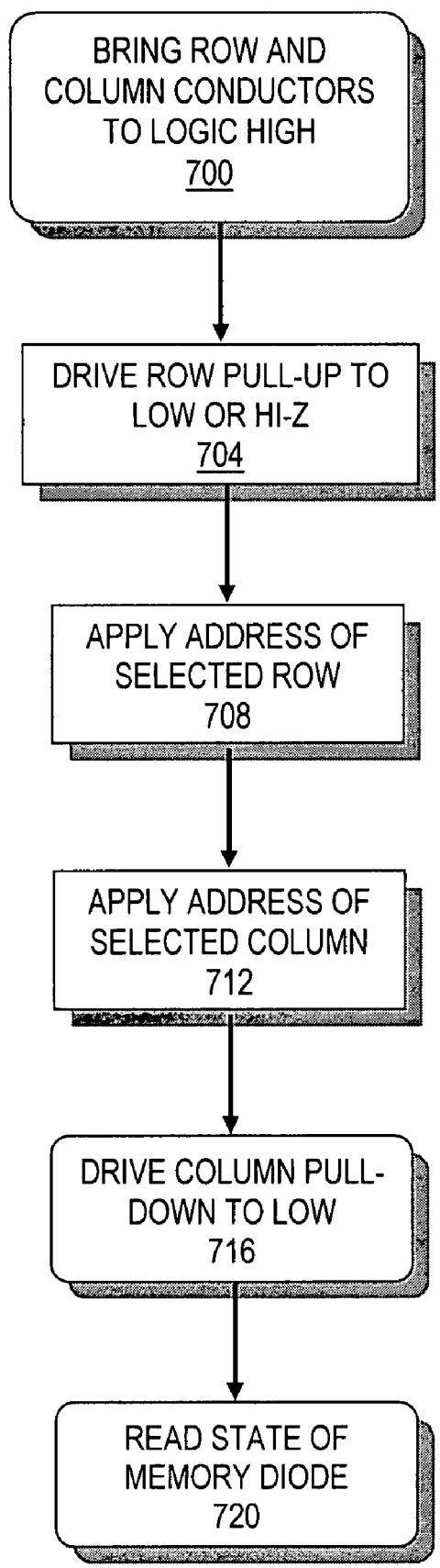
FIG. 7A presents a flowchart describing one embodiment of a method for dynamic row address decoding.
Figure 7B:
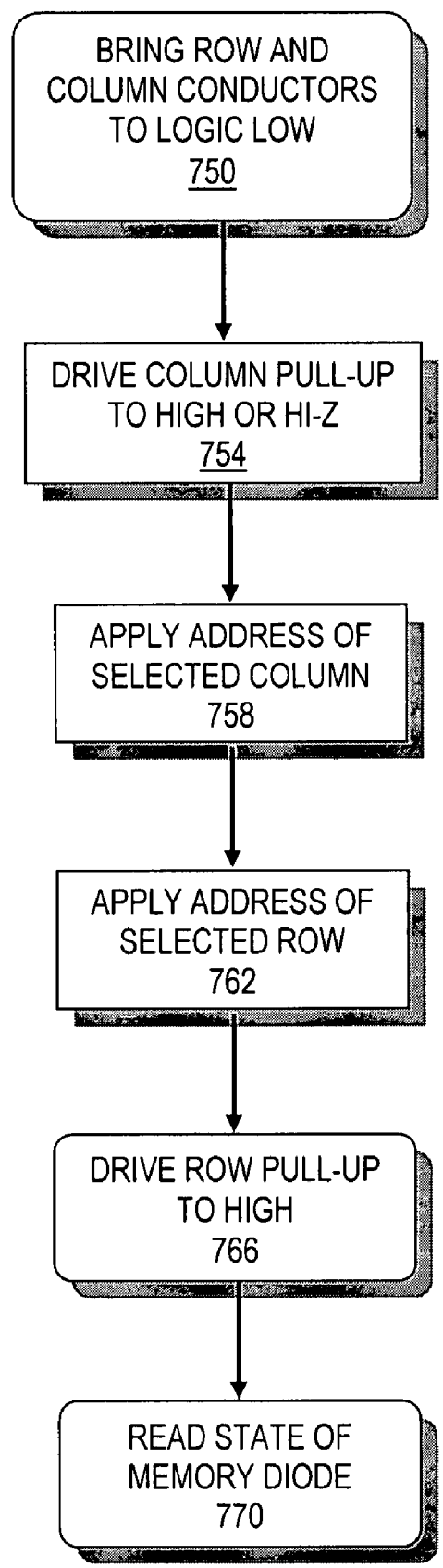
FIG. 7B presents a flowchart illustrating one embodiment of a method for dynamic column address decoding.

With continued reference to FIG. 6, circuit 600 presents a simplified representation of a memory array and decoders having a single row, a single column, decoder gates, and a memory bit at the intersection of the row and the column. Circuit 650 further simplifies the illustration in FIG. 6 to show the address decoders as single diodes D2, D3, D4, and D5, and the memory bit as D1.

With reference to Circuit 650, in static mode pullup diode D2 and pulldown diode D4 are connected to power-supply voltages and the address is set to select the addressed memory bit. The voltage at the P+ end of the memory bit will then be logic HIGH or logic LOW depending on the absence or presence of a memory-bit diode or contact opening. In other embodiments, the N+ end of the memory bit may also be used and will be logic LOW or logic HIGH depending on the absence or presence of a memory bit diode or contact opening. The absolute voltages for logic HIGH and logic LOW would generally be different between these two scenarios.

Returning to the embodiment under discussion, when the P+ end of the memory diode is connected to a row line, reading the memory requires the selected row to be HIGH and the selected column to be LOW as discussed above.

In this embodiment, one way to enable dynamic row decoding is to bring the row and column conductors to logic HIGH (Step 700), for example, by bringing the row pullup element to logic HIGH, and bringing the column pulldown element to either logic HIGH or a high impedance (i.e., Hi Z)

state. While the row and column conductors are charged, all of the row address inputs and the column address inputs are driven to logic HIGH. Next, the row pullup element is driven to logic LOW or a high impedance state (Step 704). The address of the selected row is subsequently applied to the row address bits of the row decoder input (Step 708), enabling the row address. Since the row pullup element is in a high-impedance state, enabling the row address bits does not create a static current flow. Only the selected row stays at logic HIGH, while the other rows are driven to logic LOW by the address bit diodes. Next, the address of the selected column is applied to the row address bits (Step 712). At this time the column pulldown element is in a high impedance state, so enabling the column address bits does not enable a static current flow. Finally, the column pulldown element is driven to logic LOW (Step 716). Only the selected column is pulled to logic LOW by the pulldown element, as the other columns remain in logic HIGH by the pullup connection of the column address bit diodes.

After this final step, the selected memory bit diode is now forward-biased, assuming that it is present and has closed contacts. The selected row discharges through the selected memory bit diode, bringing the selected row to logic LOW if the bit diode is present or leaving it in logic HIGH if the bit diode is either not present or has an open contact. It is these two states that are detected outside the memory array by the output-state detection circuitry (Step 720).

As discussed above, in the embodiment under discussion the selected column should be logic LOW to forward bias the selected memory bit diode. Since AND gates are possible with diode logic, the selected column determined by the inputs to the AND gate should be logic HIGH (or logic LOW for a negative logic implementation). If the gate is precharged, or operated dynamically, by definition the precharge state should be the same as the decoded state. As noted above, this presents a problem because the column decoder operates properly when precharged to the state opposite that of the decoded state. In contrast, the row decoder can be operated with the same state since it is the first block to be operated in the sequence above.

Consequentially, the column-address decoder should be operated in static mode for at least some fraction of the read access cycle. Accordingly, the column decoder gates, which should operate in static mode for some period, are either associated with all of the unselected columns or all of the unselected columns but one. For large nonsegmented arrays the number of unselected columns will be large. As an example, for a 1 Gb array, there are potentially 32,768 rows and 32,768 columns. So, in this example, 32,767 column-address decoders would operate with static power consumption during some part of the read access cycle.

Dynamic Column Address Decoder

The sequence for dynamic column address decoding is similar to the sequence for dynamic row address decoding with the row and column functionality exchanged. This similarity is one example of the symmetric nature of this circuit.

First, all of the row and column conductors are brought to logic LOW by bringing the row pullup element and the column pulldown element to logic LOW (Step 750). While the row and column conductors are charged, all of the row address inputs and column address inputs are driven to logic LOW. Next, the column pullup element is set to logic HIGH or a high impedance state (Step 754). The address of the selected column is applied to the column address bits of the column decoder input, enabling the column address (Step 758). Since the column pullup element is in an high-impedance state, enabling the column address bits does not create a static current flow. Only the selected column stays at logic LOW, while the other columns are driven to logic HIGH by the address bit diodes. Next, the address of the selected row is enabled (Step 762). At this time, the row pullup element is in a high impedance state, so enabling the row address bits does not enable a static current flow. Finally, the row pullup element is driven to logic HIGH (Step 766). Only the selected row is pulled to logic HIGH by the pullup element, as the other rows remain logic LOW by the pulldown connection of the row address bit diodes. At this point, the state of the memory diode is read from an output terminal (Step 770).

Output Column

Figure 8:
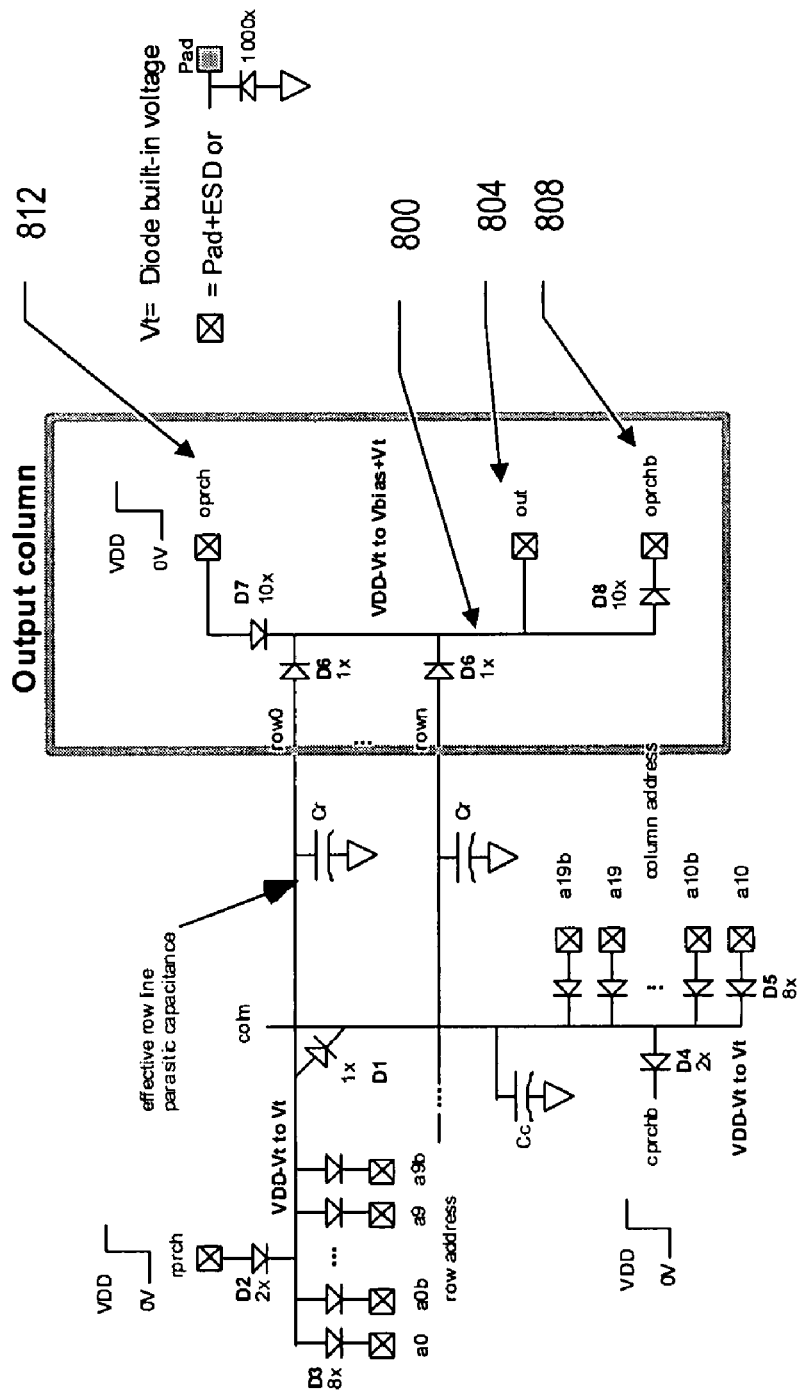
FIG. 8 shows one embodiment of an output column structure suitable for use with the present invention.

A useful memory device should provide an output that represents the state of an addressed memory array bit. Typically this is a single output node for any addressed bit. As illustrated in FIG. 8, generally an OR matrix is utilized to achieve this functionality.

With reference to FIG. 8, in this schematic there is a diode D6 at the end of each row. The common N+ terminal 800 of these diodes D6 provides an OR function, since if any of the rows are logic HIGH then the node output will also be logic HIGH, but if none of the rows are logic HIGH, then the node out will remain at its initial state. The output column function shown in FIG. 8 has two diodes, D7 and D8, which are used to set the initial state of this block. If this block is operated as a static OR gate then diode D8 represents the pulldown device.

Once again this output column may be operated statically or dynamically. If the OR matrix is operated statically then the row and column address decoders should also be operated statically, resulting in significant power consumption. Operated statically, the node out will be either logic HIGH or logic LOW depending on the state of the addressed bit location.

It should be noted that, as depicted in FIG. 8, diodes D7 and D8 are disproportionately large. If the output column is operated statically, diode D8 should be smaller than diode D6 to allow the diodes D6 to pull up the output level at the node "out" 804. In this mode of operation, the output OR gate made up of diode D6 (one for each row) and diode D8 (the gate load device) ties the node "oprchb" 808 to logic LOW voltage.

If instead the output column is operated dynamically, then the common N+ end 800 of the diodes D6 at the end of each row should be driven to logic HIGH to put all of them in an OFF or a reverse bias state. This may be achieved by setting the node "oprch" 812 at the P+ end of the diode D7 to logic HIGH.

One advantage to dynamic operation is that when the diodes D6 are reverse-biased or OFF, any external load on the pin out cannot affect the internal rows or columns of the memory array (i.e., at the P+ end of the diodes D6). This differs from the static method of operating the output column OR gate, when setting any row to logic HIGH will also charge any external loading on the pin out through the forward-biased D6 diode.

In a further embodiment, D8 and the associated pin may optionally be removed (not shown).

Dummy Row Circuit

The diode memory array described above is basically an analog circuit. All of the components in the array are either diodes or nonlinear resistors. There is no gain or 3-terminal device such as a MOSFET or bipolar transistor.

It is known that most circuits operate better when measuring a differential voltage, as opposed to measuring a single-ended voltage such as the voltage at the output of this memory array, i.e., the absolute voltage at the node "out" 804. One approach to generating a differential voltage to sense a bit state in the diode memory array is to introduce a "dummy row" circuit, a "dummy column" circuit, or a combination of a dummy row circuit and a dummy column circuit together.

A dummy row circuit represents a row with a bit diode preset, such that the row voltage always discharges. In this case the differential operation would involve measuring the difference between the addressed row voltage (either charged and therefore logic HIGH, or discharged and therefore logic LOW) and the voltage of the dummy row, which is always discharged and therefore logic LOW.

Figure 9A:
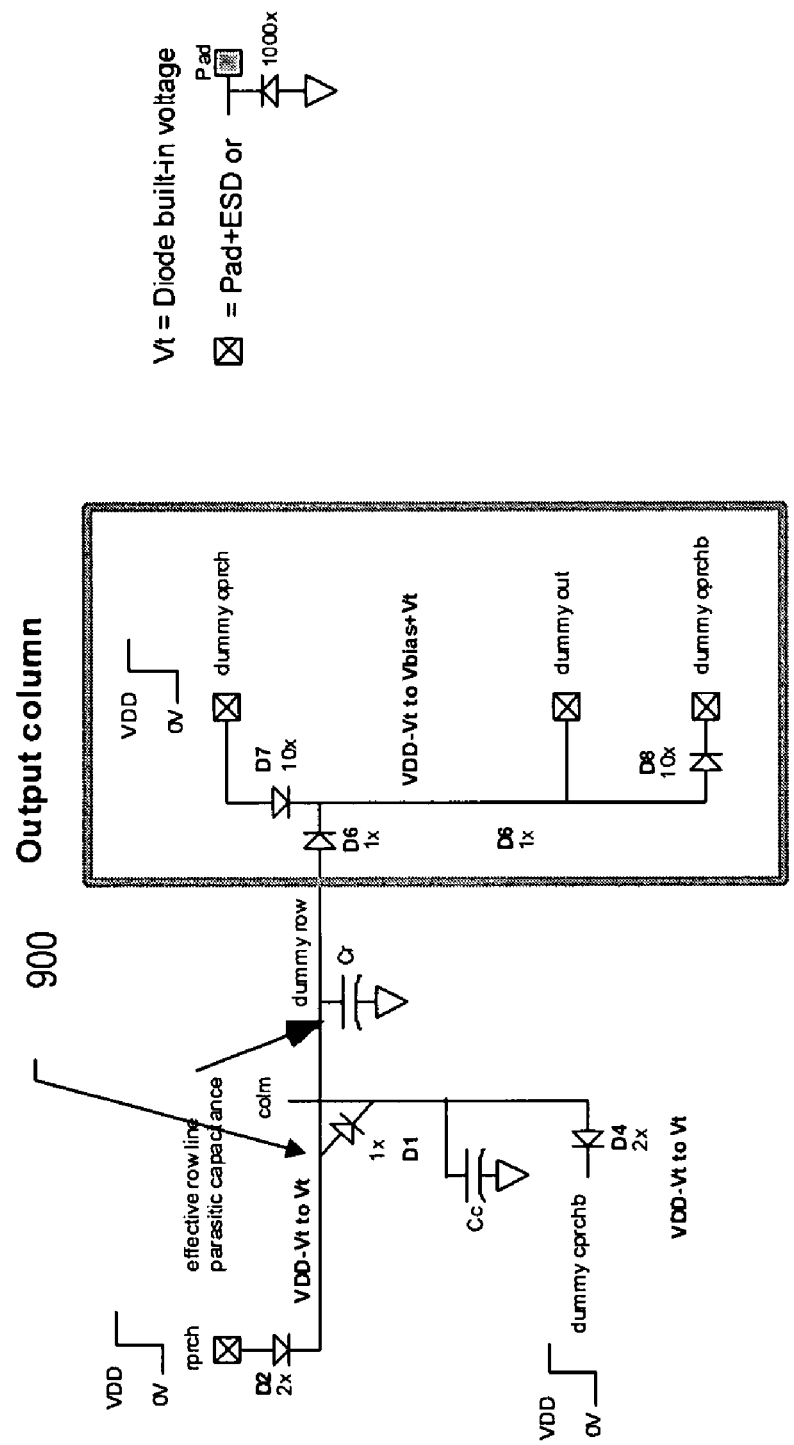
FIG. 9A presents an embodiment of a dummy row circuit suitable for use with the present invention.

FIG. 9A presents a simplified schematic for a dummy row circuit. This circuit has a simplified row 900 that allows a dummy row node to be pulled HIGH or LOW using diodes of the same size as the row address pullup diodes and column address pulldown diodes. The output block is the same as the output block for the full array depicted in FIG. 8 and is expected to generate a voltage representing the discharged row state.

The approach presented in FIG. 9A may not be optimal. In particular, the output voltage at node "out" is affected by the column output circuitry and layout. Using a dummy row architecture does not capture output voltage deviations arising from column output geometry. One alternative approach would be to use a dummy column architecture. In one embodiment the schematic shown in the output column box of FIG. 8 is duplicated to provide an additional output pin, which is analogous to the dummy row architecture shown in FIG. 9A.

Depending on the particular application, there may be advantages to having a dummy row architecture in lieu of a dummy column architecture, vice versa, or an architecture with both a dummy row and a dummy column structure.

Dummy Column Architecture

The embodiment of FIG. 9A provides logic LOW voltage from a dummy row circuit suitable for differential measurements between the dummy row and a live row circuit, i.e., having an actual voltage level of logic LOW or logic HIGH. Another approach for differential measurement, however, would compare the voltage output from a dummy circuit as measured off-package against the off-package voltage measured from a live row or column circuit. This would address voltage differences induced by electrical isolation techniques or capacitive coupling as discussed below.

Figure 9B:
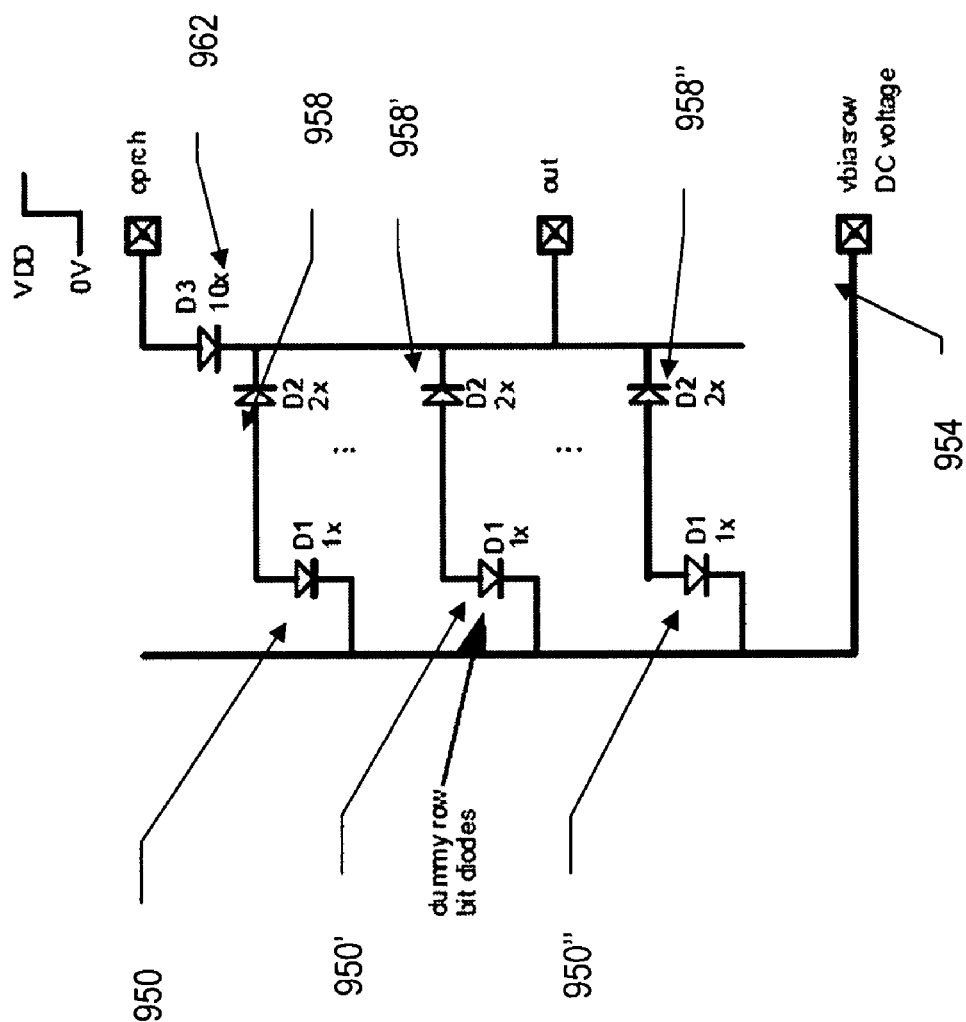
FIG. 9B presents an embodiment of a dummy column circuit suitable for use with the present invention.

Accordingly, FIG. 9B presents a dummy column circuit that presents an output voltage with a constant state. This structure is a duplicated output column having memory array bit diodes 950, 950', 950" tied to a bias voltage 954. The memory bit diodes 950 provide a facsimile of the internal voltage of a row array. The diodes 958 duplicate the output circuit of the memory array and diode 962 duplicates the pull-up device that turns off the output diodes 958.

The bias voltage 954 ("vbiasrow") is approximately 0V in simulation. In a full memory array this voltage should be determined by logic LOW voltage at the output of the selected column decoder and should be approximately one diode voltage drop. In certain applications, where the bias voltage 954 should be a diode voltage drop instead of a constant DC voltage, an on-chip diode may be introduced into the path between the bias voltage 1054 and the memory bit diodes 950 (not shown).

Yet another dummy column structure would omit the memory bit diodes 950 in their entirety and connect the P+ nodes of the output diodes 958 together (not shown). This structure assumes that for a dummy output column no charge will be transferred from the P+ side of the row output diodes 954 as the internal charge on a row is sampled. The voltage on the P+ side of those diodes 954 would therefore be expected to have little effect on the dummy output voltage.

Output Detection

One issue to be addressed in the use of passive diode arrays is reading the bit array from outside the package in a way that does not slow the part down. Conceptually, any wholly passive circuit will be sensitive to external loading, either capacitive or resistive. In a wholly passive circuit, there is no gain available to electrically isolate one part, e.g., the internal circuitry of the array, from another part, e.g., an external load from printed circuit board capacitance or the device pins of other integrated circuits. In contrast, conventional active integrated circuits utilize gain to electrically isolate one component, such as a digital output driver, from another.

In a passive memory device, this gain does not exist. Therefore, another approach must be used to isolate memory array timing from external loading. Various embodiments of the present invention approach this problem by operating the output column dynamically, thereby isolating the external loads from the internal memory array as described above.

Figure 10:
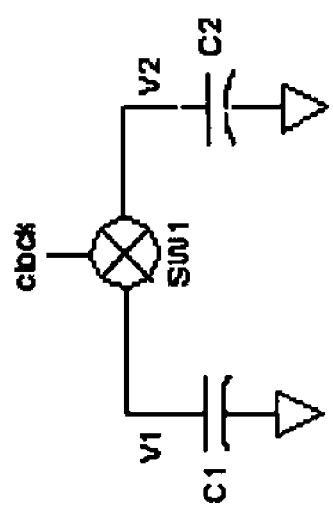
FIG. 10 presents an example of a switched capacitor circuit.

One approach used to generate an external signal, which can be used to determine if the state of a selected internal memory array bit is a "1" or a "0," utilizes a switched capacitor circuit. FIG. 10 presents an example of a simple switched capacitor circuit. Capacitor C1 and capacitor C2 have different initial voltages. Typically, one capacitor has no voltage, (e.g., 0 V on C2) and the other capacitor is charged to some positive voltage (e.g., V1 on C1). When switch SW1 is closed, charge flows from the charged capacitor to the uncharged capacitor. When switch SW1 is open, the capacitors are electrically isolated from each other.

The circuit in FIG. 10 may be analogized to a diode memory array device. Functionally, C1 represents the on-chip capacitance of a selected row. The off-chip parasitic capacitance is functionally represented by C2, which would typically be much larger than C1. Since C2 is larger than C1, if it were electrically connected to C1, then it would slow the discharge of a selected row during a read cycle. To prevent C2 from slowing down the discharge of any selected row during the read cycle, a switch, represented by SW1, is used to isolate C2 during the read or discharge activity.

With further reference to FIG. 10, if the capacitance of C1 is equal to the capacitance of C2, then when SW1 is closed, the voltage across capacitor C1, V1, and the voltage across capacitor C2, V2, will equalize as charge from one capacitor moves to the other capacitor. If V1 is greater than V2, then charge will move from C1 to C2. The final, equal voltage appearing on C1 and C2 can be shown to be $V_f=(V_1*C_1+V_2*C_2)/(C_1+C_2)$.

If the voltage across capacitor C2, V2, is initially zero, then Vf reduces to $V_f=(V_1*C_1)/(C_1+C_2)$, and the final voltage depends on the capacitance ratio between the capacitors. Accordingly, to maximize the signal to noise ratio, i.e., the change in V2, the output signal from the memory array, C2 should be made as small as possible.

Applying this concept to the diode memory array context requires the introduction of the equivalent of the switch SW1 to isolate the capacitance of the external load, C2, from the capacitance of the memory array, C1. One implementation of this approach is shown in FIG. 11.

Figure 11:
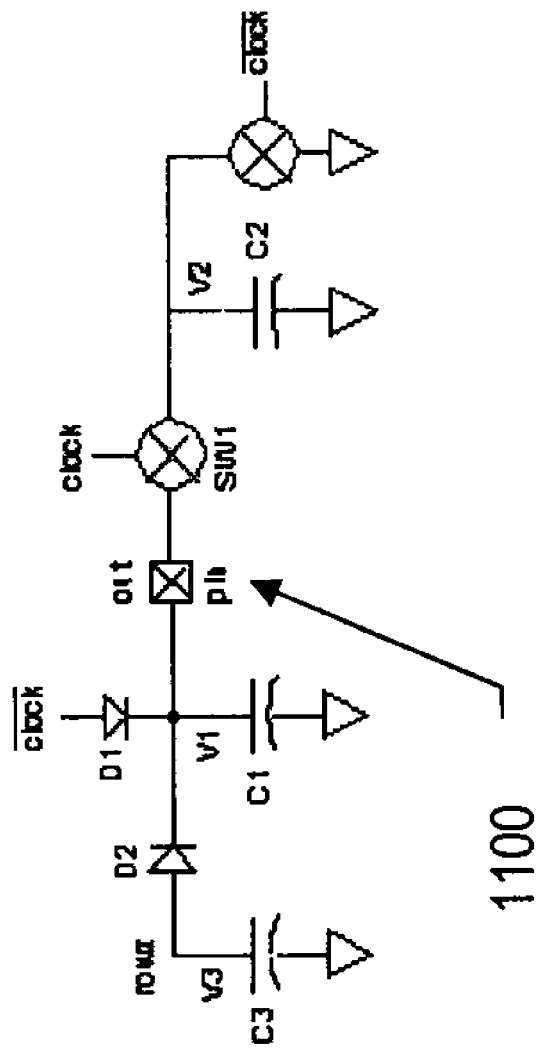
FIG. 11 presents an output isolation circuit for use with a memory array.

In FIG. 11, the symbol labeled "pin" 1100 represents the boundary between the diode memory array chip and the off-chip circuitry. The off-chip circuitry itself still has a switch SW1 and a sampling capacitor C2. Since this part of the circuit is off-chip, it can be implemented in CMOS on a controller or interface device to which the memory array connects. On-chip devices are limited by design to diodes, and the diode D1 and the diode D2 are used here as switches (like SW1) to isolate the on-chip circuitry from the off-chip circuitry. D2 here is equivalent to the D6 diodes in FIG. 8, and D1 is equivalent to the D7 pullup diode in FIG. 8.

V3 in FIG. 11 is the equivalent of the row voltage of a row in the array that is selected or addressed. V1 represents a node called the "out" node, which corresponds to a selected row. If $\overline{\text{clock}}$ is logic HIGH, then D1 in FIG. 11 pulls up on the "out" node. When the "out" node is raised to logic HIGH, diode D2 will be OFF since it will be reverse-biased. This isolates the node row (rowx in FIG. 11) from the capacitance C1. In FIG. 11, C1 represents a lumped capacitance including both on-chip parasitic capacitance and off-chip capacitance (e.g., wiring to the external circuitry containing SW1, for example).

The rows in the array, such as rowx, can now be discharged by a selected memory bit if there is a contact to the diode top, or remains undischarged if there is no contact and C1 is therefore not detectable (since D2 is OFF, i.e., reverse-biased). Setting $\overline{\text{clock}}$ to logic LOW will not affect this, since D1 will be OFF, leaving the voltage V1 at node "out" unchanged, except for coupling through the diode capacitance of D1.

With $\overline{\text{clock}}$ LOW, the circuit in FIG. 11 is at the same point as the initial state of the circuit in FIG. 10: V2 is at 0V, SW1 is OFF and V1 is at some voltage determined by the row activity. The charge on C3 can then be moved onto C1 and C2 by turning SW1 ON, resulting in the following sequence of events. First, SW1 ON connects V2 to V1, lowering V1 until the voltage on V1 equals the voltage on V2. Next, if V1 is lowered enough so that the voltage on V1 is less than the voltage on V3, then diode D2 will turn on, dumping charge onto C1 and C3. This additional charge will raise the final voltages V1 and V2 by a small amount. If V3 is less than the equal final voltages on C1 and C2, then no additional charge from node rowx moves to C1 and C2, leaving the final voltage unchanged.

In this sequence of events, the voltage difference between the equal final voltages Vf on C1 and C2 when V3 is less than or greater than Vf is the output signal from the array. This output signal is now off-chip and potentially inside another device where SW1 and C2 are located.

One benefit of this approach is that the final voltage on C2 is not dependent on a closed-loop gain block such as an op amp. In fact, the charge transfer from node rowx will likely only be limited by the series resistance of diode D2. This RC-limited charge transfer can be very fast. For example, a 1 kΩ resistor and a 1 pF capacitor have an associated RC time constant of one nanosecond; these are reasonable device sizes for the memory arrays being considered. The RC time constants are also compatible with typical memory access rates of approximately less than 10 MHz.

It will therefore be seen that the foregoing represents a highly advantageous approach to the construction of diode memory arrays. The terms and expressions employed herein are used as terms of description and not of limitation and there is no intention, in the use of such terms and expressions, of excluding any equivalents of the features shown and described or portions thereof, but it is recognized that various modifications are possible within the scope of the invention claimed. For example, although the aforementioned embodiments depict diodes in a particular orientation, further embodiments of the present invention may utilize diodes in a different orientation and nothing in this discussion is intended to limit the scope of the present invention to embodiments illustrated in the figures. For example, one embodiment of the present invention utilizes semiconductor memory fabricated in three dimensions, such as the memory described in U.S. Pat. No. 6,956,757.

Therefore, it must be expressly understood that the illustrated embodiments have been shown only for the purposes of example and should not be taken as limiting the invention, which is defined by the following claims. The following claims are thus to be read as not only literally including what is set forth by the claims but also to include all equivalents that are insubstantially different, even though not identical in other respects to what is shown and described in the above illustrations.

What is claimed is:

1. An information-storage circuit comprising:
    a first set of generally parallel conductive lines;
    a second set of generally parallel conductive lines that is generally perpendicular to and overlapping with the first set of lines;
    a plurality of bit states, with each bit state of said plurality occurring in the general vicinity of a region of overlap between a line from the first set of lines and a line from the second set of lines, and the state of any bit state being determined by the presence or absence of a nonlinear element bridging a line from the first set of lines and a line from the second set of lines at a region of overlap;
    a reference generator for providing a reference value adapted for measurement, the reference value being based at least in part on current flowing through a nonlinear element disposed in at least one of a dummy row or a dummy column; and
    state measurement circuitry for determining a selected bit state by comparing the state of a selected bit against the reference value.

2. The circuit of claim 1 wherein the state measurement circuitry measures a charge associated with a selected bit.

3. The circuit of claim 2 further comprising a plurality of capacitances, wherein each measured charge is stored on a capacitance.

4. The circuit of claim 1 further comprising a plurality of capacitances, wherein each capacitance is associated with one of said nonlinear elements.

5. The circuit of claim 4 wherein each capacitance occurs between one of said nonlinear elements and one line selected from said first set of lines or said second set of lines.

6. The circuit of claim 1 further comprising a plurality of capacitances, wherein each capacitance occurs between a first line from said first set of lines and a second line from said second set of lines.

7. The circuit of claim 1 wherein the state measurement circuitry comprises a comparator.

8. The circuit of claim 1 wherein the reference generator is a dummy row circuit.

9. The circuit of claim 1 wherein the reference generator is a dummy column circuit.

10. The circuit of claim 1 wherein the nonlinear element is selected from the group consisting of a diode, a series combination of a diode and a contact opening, and a series combination of a diode and a one-time programmable element.

11. The circuit of claim 1 wherein the state measurement circuitry is off-package.

12. The circuit of claim 1 further comprising a dynamic address decoder for selecting at least one line in the first and second sets of generally parallel conductive lines.

13. A method for determining bit state in an information-storage circuit, the method comprising:
    providing a first set of generally parallel conductive lines;

providing a second set of generally parallel conductive lines that is generally perpendicular to and overlapping with the first set of lines;

providing a plurality of bit states, with each bit state of said plurality occurring in the general vicinity of a region of overlap between a line from the first set of lines and a line from the second set of lines, and the state of any bit state being determined by the presence or absence of a nonlinear element bridging a line from the first set of lines and a line from the second set of lines at a region of overlap;

providing a reference generator for providing a reference value adapted for measurement, the reference value being based at least in part on current flowing through a nonlinear element disposed in at least one of a dummy row or a dummy column; and providing state measurement circuitry for determining a selected bit state by comparing the state of a selected bit against the reference value.

14. The method of claim 13 wherein determining a selected bit state comprises measuring a charge associated with a selected bit.

15. The method of claim 14 further comprising providing a plurality of capacitances, wherein each measured charge is stored on a capacitance.

16. The method of claim 13 further comprising providing a plurality of capacitances, wherein each capacitance is associated with one of said nonlinear elements.

17. The method of claim 16 wherein each capacitance occurs between one of said nonlinear elements and one line selected from said first set of lines or said second set of lines.

18. The method of claim 13 further comprising providing a plurality of capacitances, wherein each capacitance occurs between a first line from said first set of lines and a second line from said second set of lines.

19. The method of claim 13 wherein comparing the state of the selected bit against the reference value comprises using a comparator.

20. The method of claim 19 wherein the comparator is operated synchronously with the information-storage circuit.

21. The method of claim 19 further comprising detecting a change using the comparator in at least one of charge, voltage and current to determine a digital output state.

22. The method of claim 13 wherein determining the selected bit state comprises determining the presence or absence of a diode.

23. The method of claim 13 wherein determining the selected bit state comprises determining the presence or absence of a series combination of a diode and a contact opening.

24. The method of claim 13 wherein determining the selected bit state comprises determining the presence or absence of a series combination of a diode and a one-time programmable element.

25. The method of claim 13 wherein providing the reference generator comprises providing a dummy row circuit.

26. The method of claim 13 wherein providing the reference generator comprises providing a dummy column circuit.

27. The method of claim 13 wherein the state measurement circuitry is off-package.

28. The method of claim 13 further comprising providing a dynamic address decoder for selecting at least one line in the first and second sets of generally parallel conductive lines.

* * * * *